United States Patent
Okada

(10) Patent No.: US 8,090,333 B2
(45) Date of Patent: Jan. 3, 2012

(54) RECEIVING APPARATUS, RECEIVING METHOD, AND PROGRAM

(75) Inventor: Takahiro Okada, Saitama (JP)

(73) Assignee: Sony Corporation (JP)

( * ) Notice: Subject to any disclaimer, the term of this patent is extended or adjusted under 35 U.S.C. 154(b) by 1117 days.

(21) Appl. No.: 11/906,866

(22) Filed: Oct. 4, 2007

(65) Prior Publication Data

US 2008/0090536 A1    Apr. 17, 2008

(30) Foreign Application Priority Data

Oct. 6, 2006 (JP) ................. P2006-274770

(51) Int. Cl.
*H04B 1/18* (2006.01)
(52) U.S. Cl. ... 455/192.2; 455/62; 455/63.1; 455/67.11; 455/67.13; 455/164.1; 455/165.1; 455/173.1; 455/182.2; 455/182.3; 455/257; 375/326; 375/327; 375/339; 375/340; 375/344; 375/346
(58) Field of Classification Search .......... 455/63.1, 455/192.1, 62, 67.11, 67.13, 147, 164.1, 455/165.1, 173.1, 182.2, 182.3, 184.1, 192.2, 455/192.3, 255–260, 316; 375/326, 327, 375/344, 339, 340, 346
See application file for complete search history.

(56) References Cited

U.S. PATENT DOCUMENTS

| | | | | |
|---|---|---|---|---|
| 6,341,123 | B1 * | 1/2002 | Tsujishita et al. | 370/210 |
| 6,947,499 | B2 * | 9/2005 | Sakurai | 375/327 |
| 7,447,277 | B2 * | 11/2008 | Yajima et al. | 375/326 |
| 7,733,986 | B2 * | 6/2010 | Fujii et al. | 375/327 |

FOREIGN PATENT DOCUMENTS

| | | |
|---|---|---|
| JP | 2000022584 A | 1/2000 |
| JP | 2000106578 A | 4/2000 |
| JP | A 2001-292123 | 10/2001 |
| JP | 2002152294 A | 5/2002 |

OTHER PUBLICATIONS

Office Action from Japanese Application No. 2006-274770, dated Jun. 14, 2011.

* cited by examiner

*Primary Examiner* — Junpeng Chen
(74) *Attorney, Agent, or Firm* — Lerner, David, Littenberg, Krumholz & Mentlik, LLP

(57) ABSTRACT

A receiving apparatus includes: a demodulating unit which demodulates an IF signal obtained by subjecting a received RF signal to frequency conversion; a detecting unit which detects a carrier wave frequency error contained in the IF signal; a frequency control unit which sets an initial value of a frequency in the demodulation process by the demodulating unit and for correcting a frequency error of a frequency used for the demodulation process by the demodulating unit based on the carrier wave frequency error detected by the detecting unit; and a control unit which controls a setting of an initial value of a frequency in the demodulation process by the demodulating unit by means of the frequency control unit after a receiving channel is switched, based on the carrier wave frequency error before a receiving channel is switched, the error being detected by the detecting unit, when a receiving channel is switched.

10 Claims, 11 Drawing Sheets

RECEIVING APPARATUS, RECEIVING METHOD, AND PROGRAM

CROSS REFERENCE TO RELATED APPLICATIONS

The present application claims priority from Japanese Patent Application No. JP 2006-274770 filed in the Japanese Patent Office on Oct. 6, 2006, the entire content of which is incorporated herein by reference.

BACKGROUND OF THE INVENTION

1. Field of the Invention

The present invention relates to a receiving apparatus, a receiving method, and a program, particularly to a receiving apparatus, a receiving method, and a program which can quickly obtain a base band signal with no frequency error.

2. Description of the Related Art

For a scheme of transmitting digital signals, the OFDM (Orthogonal Frequency Division Multiplexing) modulation is widely used. The OFDM modulation is a scheme that transmits signals in which digital modulated waves are multiplexed in multicarrier modulation, the digital modulated waves having a few tens to a few hundreds or a few thousands of orthogonal carrier wave frequencies.

In receiving signals using the OFDM modulation, there is a technique in which frequency errors contained in IF signals are detected by a carrier wave error detection circuit, whereby base band signals with no frequency error are obtained (for example, Patent Reference 1 (JP-A-2001-292123)).

FIG. 1 shows an exemplary configuration of a receiving apparatus 1 before to which the technique described in Patent Reference 1 is applied.

The receiving apparatus 1 has an antenna 11, a mixer 12, a local oscillator 13, a PLL (Phase Locked Loop) 14, a bandpass filter (BPF) 15, an A/D converting part 16, an orthogonal demodulating part 17, FFT (Fast Fourier Transform) computing part 18, a narrow band carrier wave frequency error detecting part 19, a wide band carrier wave frequency error detecting part 20, an adding part 21, and a controller 22.

The antenna 11 receives an RF signal at a center frequency $f_{RF}$. The received RF signal is supplied to the mixer 12. The local oscillator 13 configured of a crystal oscillator oscillates the reference signal, the oscillated reference signal is multiplied by the PLL 14, and the oscillation signal at the frequency $f_{LO}$ is supplied to the mixer 12. The mixer 12 multiplies the supplied RF signal by the reference signal, and converts the RF signal into the IF signal at a predetermined center frequency $f_{IF}$.

Harmonic components contained in the output of the mixer 12 are removed by the bandpass filter 15, and the remains are supplied to the A/D converting part 16.

Then, the A/D converting part 16 samples the IF signal supplied from the bandpass filter 15 from which the harmonic components are removed, and digitizes the IF signal. The IF signal digitized by the A/D converting part 16 is supplied to the orthogonal demodulating part 17.

The orthogonal demodulating part 17 is configured of an NCO (Numerically Controlled Oscillator) 31 which is a numeric value control the oscillator and multiplying parts 32-1 and 32-2. The orthogonal demodulating part 17 subjects the digitized IF signal to orthogonal demodulation, converts it into a base band signal of an in-phase component and a quadrature component (a complex signal that contains a real axis component referred to as an I-channel signal and an imaginary axis component referred to as a Q-channel signal), and supplies it to the FFT computing part 18 and the narrow band carrier wave frequency error detecting part 19.

The FFT computing part 18 subjects the OFDM time domain signal to FFT computation to extract modulated data for each subcarrier, subjects the supplied base band signal to OFDM demodulation to obtain the received signal, and supplies it to the wide band carrier wave frequency error detecting part 20 and a signal processing system in a later stage, not shown, (for example, an equalizer).

The narrow band carrier wave frequency error detecting part 19 computes narrow band carrier frequency error components showing the shift amount of the center frequency of the OFDM time domain signal after orthogonal demodulation by the orthogonal demodulating part 17. More specifically, the narrow band carrier wave frequency error detecting part 19 computes the shift amount of the center frequency having an accuracy of ±½ of the subcarrier frequency interval (for example, 4.14 Hz) or below, that is, the narrow band carrier frequency error component, and supplies it to the adding part 21.

In other words, the narrow band carrier wave frequency error detecting part 19 determines a correlation between the waveform in the guard interval portion and the waveform in the later half of the OFDM symbol (that is, the original signal waveform of the guard interval) for the OFDM time domain signal, and determines the order portion of the OFDM symbol based on the correlation. The function that expresses the determined correlation is a complex signal, and the phase component of the order portion of the OFDM symbol in the function is information about an accuracy of ±½ of the subcarrier frequency interval of the carrier frequency error component or below.

The wide band carrier wave frequency error detecting part 20 computes wide band carrier frequency error components showing the shift amount of the center frequency of the OFDM time domain signal for the OFDM frequency domain signal after FFT computation. More specifically, the wide band carrier wave frequency error detecting part 20 computes the shift amount of the center frequency in an accuracy of the subcarrier frequency interval (for example, 4.14 Hz), and supplies it to the adding part 21.

Generally, the OFDM signal contains a pilot signal called a CP (Continual Pilots) signal. The CP signal is a signal that always indicates a particular phase and amplitude, which is inserted into the subcarrier of a plurality of indexes in an effective symbol. The number of the CP signals contained in the effective symbol and the pattern of arranging the insertion positions of the CP signals are defined by standards.

The wide band carrier wave frequency error detecting part 20 subjects the OFDM frequency domain signal after FFT computation to differential demodulation two times between symbols temporally apart from each other, extracts the CP signal, and computes the carrier frequency error component of the OFDM signal by calculating how much the subcarrier position of the extracted CP signal is shifted from the original subcarrier position.

The adding part 21 adds the narrow band carrier frequency error component computed by the narrow band carrier wave frequency error detecting part 19 to the wide band carrier frequency error component computed by the wide band carrier wave frequency error detecting part 20 to compute the total shift amount of the center frequency of the base band OFDM signal. The adding part 21 supplies the computed total shift amount of the center frequency, that is, the frequency error information as an error component err to the NCO 31.

To the adding part 21, the controller 22 supplies the preset values of the oscillation frequencies of the NCO 31 in the first time reception operation after the power source of the receiving apparatus 1 is turned on and the reception operation after the channel is changed.

In the first time reception operation after the power source of the receiving apparatus 1 is turned on, the NCO 31 of the orthogonal demodulating part 17 supplies the signal at the originating frequency based on the preset value supplied from the adding part 21 to the multiplying parts 32-1 and 32-2. Then, after that, the NCO 31 receives an error component err from the adding part 21, and then generates an fc error correction signal that is a correction signal for correcting the error of the center frequency fc in the frequency tuning range and rises and drops depending on the error component err. For example, the NCO 31 controls the signal in such a way that it drops the oscillation frequency of the fc error correction signal when the supplied error component err is a positive value, whereas it raises the oscillation frequency of the fc error correction signal when the supplied error component err is a negative value. The NCO 31 controls the signal in this manner, whereby it generates such an fc error correction signal that the oscillation frequency becomes constant at the point at which the error component err is zero.

Next, the operation in the case in which the receiving apparatus 1 selects channels will be described.

When a user selects a channel, the PLL 14 generates a first channel originating signal at a frequency matched with the channel, and the mixer 12 performs frequency conversion so that the center frequency of a desired wave is $f_{IF}$.

A channel originating signal frequency $f_{LO1}$ is expressed by the following Equation (1), where the RF signal center frequency of the selected channel is $f_{RF1}$.

$$f_{LO1}=f_{RF1}+f_{IF} \quad (1)$$

In the receiving apparatus 1 shown in FIG. 1, the scheme of upstream channel transmission is adopted, but it is the same in the case of downstream channel transmission.

The IF signal that the harmonic component is removed by the bandpass filter 15 is subjected to A/D conversion in the A/D converting part 16, and then it is subjected to orthogonal demodulation in the orthogonal demodulating part 17 with a second channel originating signal generated in the NCO 31. Suppose the second channel originating signal frequency to be generated in the NCO 31 is $f_{NCO}$.

Generally, in the first time reception operation after the power source of the receiving apparatus 1 is turned on, the oscillation frequency $f_{NCO}$ of the NCO 31 is preset to the value expressed by the following Equation (2).

$$f_{NCO}=f_{IF} \quad (2)$$

Frequency errors sometimes occur in the PLL reference signal that is supplied from the PLL 14 to the mixer 12 because of the accuracy of the crystal oscillator used by the local oscillator 13. The frequency of the reference signal that is supplied from the PLL 14 to the mixer 12 in the case in which frequency errors occur in the reference signal is given by $f_{ref(1+e)}$ where the ratio of errors is e. When frequency errors occur in the reference signal, the same errors occur in a first channel originating frequency that is obtained by multiplying the reference signal. The first channel originating frequency $f_{LO1(1+e)}$ where the reference signal is given by $f_{ref(1+e)}$ is expressed by the following Equation (3).

$$f_{LO1(1+e)}=f_{LO1}+e \times f_{LO1} \quad (3)$$

In other words, when a frequency error occurs in the reference signal where the ratio of errors is e, a frequency error occurs in the first channel originating frequency by $e \times f_{LO1}$. The frequency error also causes a frequency error in the IF signal. The center frequency $f_{IF1}$ of the IF signal with the frequency error is expressed by the following Equation (4).

$$f_{IF1}=f_{IF}+e \times f_{LO1} \quad (4)$$

In other words, the frequency error $f_{err1}$ contained in the IF signal is expressed by the following Equation (5).

$$f_{err1}=e \times f_{LO1} \quad (5)$$

The narrow band carrier wave frequency error detecting part 19 and the wide band carrier wave frequency error detecting part 20 detect these frequency errors. Since the NCO 31 of the orthogonal demodulating part 17 is controlled in such a way that the oscillation frequency becomes constant at the point at which the error component err is zero in accordance with the error component err outputted from the adding part 21, the oscillation frequency $f_{NCO}$ is stabilized to $f_{IF1}$ after a certain time period has passed.

In other words, the narrow band carrier wave frequency error detecting part 19 and the wide band carrier wave frequency error detecting part 20 detect the error component err that indicates the shift amount of the center frequency, and feed the error component err back to the NCO 31. The NCO 31 generates the fc error correction signal in which the oscillation frequency fluctuates in accordance with the error component err, and supplies it to the multiplying parts 32-1 and 32-2. Then, the multiplying parts 32-1 and 32-2 subject the fc error correction signal to complex multiplication for the OFDM signal of the base band, whereby the carrier frequency error is corrected to obtain the base band signal with no frequency error.

Then, in the case in which it is instructed to change the channel, the process steps described above are repeated.

SUMMARY OF THE INVENTION

As described above, the NCO 31 of the orthogonal demodulating part 17 is controlled in such a way that the oscillation frequency $f_{NCO}$ becomes constant at the point at which the error component err is zero in accordance with the error component err outputted from the adding part 21. Thus, after a certain time period has passed, the oscillation frequency $f_{NCO}$ is stabilized to $f_{IF1}$. In the receiving apparatus 1 before, the error component err is detected at every time when the channel is changed, and the apparatus is controlled in such a way that the oscillation frequency $f_{NCO}$ of the NCO 31 becomes constant at the point at which the error component err is zero. Thus, a certain time period is necessary until the oscillation frequency $f_{NCO}$ is stabilized to $f_{IF1}$.

In contrast to this, it is demanded that the synchronization time for which the oscillation frequency $f_{NCO}$ of the NCO 31 is stabilized to $f_{IF1}$ is shortened and the base band signal with no frequency error is quickly obtained after the channel is changed.

Thus, it is desirable to allow quickly obtaining the base band signal with no frequency error in the case in which signals are received.

An information processing apparatus according to an embodiment of the invention is an information processing apparatus including: a demodulating means for demodulating an IF signal obtained by subjecting a received RF signal to frequency conversion; a detecting means for detecting a carrier wave frequency error contained in the IF signal; a frequency control means for setting an initial value of a frequency in the demodulation process done by the demodulating means and for correcting a frequency error of a frequency used for the demodulation process done by the demodulating means based on the carrier wave frequency error detected by the detecting means; and a control means for controlling a setting of an initial value of a frequency in the demodulation process done by the demodulating means by means of the frequency control means after a receiving channel is switched, based on the carrier wave frequency error before a receiving channel is switched, the error being detected by the detecting means, in the case in which a receiving channel is switched.

The control means may include: an error computing means for computing a frequency error corresponding to the case in which an initial value of a frequency used in the demodulation process done by the demodulating means is a center frequency of a desired wave based on the carrier wave frequency error before a receiving channel is switched, the error being detected by the detecting means; an estimating means for estimating a frequency error after a channel is switched based on a frequency error computed by the error computing means and a ratio between channel originating signal frequencies before and after a channel is changed in the case in which no frequency error occurs; and an initial value computing means for computing an initial value of a frequency in the demodulation process done by the demodulating means based on a frequency error after a receiving channel is switched, the error being estimated by the estimating means.

The control means may further include: an area setting means for setting a search area in which a carrier wave frequency error contained in the IF signal is detected by means of the detecting means based on a frequency error after a receiving channel is switched, the error being estimated by the estimating means.

The detecting means may detect a carrier wave frequency error contained in the IF signal by pattern matching.

The detecting means may detect a carrier wave frequency error contained in the IF signal based on a shift amount of a pilot signal contained in a received signal from an original subcarrier position to a subcarrier position.

A receiving method according to an embodiment of the invention is a receiving method of a receiving apparatus which receives signals, the receiving method including the steps of: demodulating an IF signal obtained by subjecting a received RF signal to frequency conversion; detecting a carrier wave frequency error contained in the IF signal; correcting a frequency error of a frequency used for a demodulation process based on the detected carrier wave frequency error; and controlling a setting of an initial value of a frequency in a demodulation process after a receiving channel is switched, based on the carrier wave frequency error before a receiving channel is switched, in the case in which a receiving channel is switched.

The step of controlling the setting of the initial value of the frequency in the demodulation process after a receiving channel is switched may include the step of estimating a frequency error after a receiving channel is switched based on the carrier wave frequency error before a receiving channel is switched.

The method may further include the step of setting a search area in which a carrier wave frequency error contained in the IF signal is detected based on an estimated frequency error after a receiving channel is switched.

A program according to an embodiment of the invention is a program which can be executed by a computer that controls a reception process of a receiving apparatus having a functionality of detecting a carrier wave frequency error contained in an IF signal obtained by subjecting a received RF signal to frequency conversion to correct a frequency error, the program allowing the computer to execute a process including the steps of: computing a frequency error corresponding to the case in which an initial value of a frequency used for a demodulation process of the IF signal is a center frequency of a desired wave based on a detected result of a carrier wave frequency error contained in the IF signal before a receiving channel is switched in the case in which a receiving channel is switched; estimating a frequency error after a receiving channel is switched based on a computed frequency error and a ratio between channel originating signal frequencies before and after a channel is changed in the case in which no frequency error occurs; and controlling a setting of an initial value of a frequency in a demodulation process after a receiving channel is switched based on an estimated result of a frequency error after a receiving channel is switched.

The program may further include the step of setting a search area in which a carrier wave frequency error contained in the IF signal is detected based on an estimated frequency error after a receiving channel is switched.

According to an embodiment of the invention, an IF signal obtained by subjecting a received RF signal to frequency conversion is demodulated; a carrier wave frequency error contained in the IF signal is detected; a frequency error of a frequency used for the demodulation process is corrected based on the detected carrier wave frequency error; and in the case in which a receiving channel is switched, a setting of an initial value of a frequency in the demodulation process after a receiving channel is switched is controlled based on the carrier wave frequency error before a receiving channel is switched.

A network is a scheme in which at least two apparatuses are connected, and information can be transmitted from one apparatus to the other apparatus. Apparatuses that communicate with each other through a network may be separate apparatuses, or may be internal blocks that configure a single apparatus.

In addition, communications may of course be radio communications and wire communications, and may be communications mixed with radio communications and wire communications, that is, communications in which radio communications are performed in one section and wire communications are performed in another section. Moreover, communications may be communications in which one apparatus communicates with the other apparatus in wire communications, whereas the other apparatus communicates with one apparatus in radio communications.

The information processing apparatus which controls the received signal may be included in the receiving apparatus, or may be a separate apparatus. In addition, the receiving apparatus may be a separate apparatus, or may be a block which performs a reception process of a transmitter-receiver apparatus and an information processing apparatus.

According to an embodiment of the invention, the IF signal can be demodulated. Particularly, in the case in which the receiving channel is switched, the setting of the initial value of the frequency in the demodulation process after the receiving channel is switched based on the carrier wave frequency error before the receiving channel is switched. Therefore, in the case in which signals are received, the base band signal with no frequency error can be quickly obtained.

DETAILED DESCRIPTION OF THE INVENTION

Figure 1:
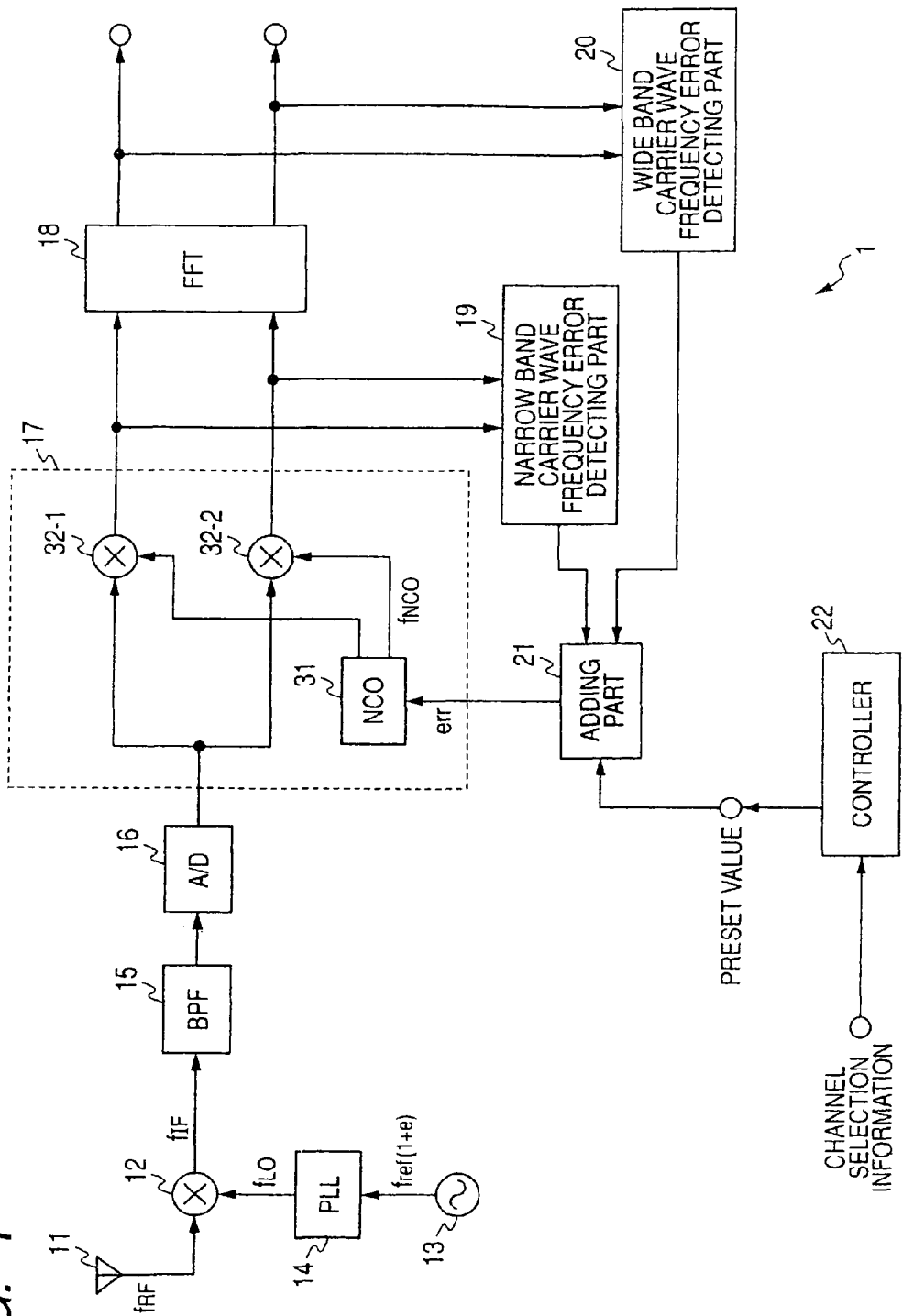
FIG. 1 shows a block diagram depicting the configuration of a receiving apparatus before.

Hereinafter, an embodiment of according to an embodiment of the invention will be described. The following is examples of the correspondence between configuration requirements for according to an embodiment of the invention and the embodiments of the specification or the drawings. This is described for confirming that the embodiments supporting according to an embodiment of the invention are described in the specification or the drawings. Therefore, even though there is an embodiment that is described in the specification or the drawings but is not described herein as an embodiment corresponding to configuration requirements for the invention, it does not mean that the embodiment does not correspond to those configuration requirements. Contrary to this, even though an embodiment is described herein as an embodiment corresponding to configuration requirements, it does not mean that the embodiment does not correspond to configuration requirements other than those configuration requirements.

A receiving apparatus according to an embodiment of the invention is a receiving apparatus including:

a demodulating means (for example, an orthogonal demodulating part 17) for demodulating an IF signal obtained by subjecting a received RF signal to frequency conversion; a detecting means (for example, a narrow band carrier wave frequency error detecting part 19, a wide band carrier wave frequency error detecting part 20, or a wide band carrier wave frequency error detecting part 112) for detecting a carrier wave frequency error contained in the IF signal; a frequency control means (for example, an adding part 71) for setting an initial value (for example, a preset value) of a frequency in the demodulation process done by the demodulating means and for correcting a frequency error of a frequency (for example, the oscillation frequency $f_{NCO}$) used for the demodulation process done by the demodulating means based on the carrier wave frequency error detected by the detecting means; and a control means (for example, a controller 72 or a controller 111) for controlling a setting of an initial value of a frequency in the demodulation process done by the demodulating means by means of the frequency control means after a receiving channel is switched, based on the carrier wave frequency error before a receiving channel is switched, the error being detected by the detecting means, in the case in which a receiving channel is switched.

The control means may include: an error computing means (for example, a frequency error computing part 92) for computing a frequency error corresponding to the case in which an initial value of a frequency used in the demodulation process done by the demodulating means is a center frequency of a desired wave based on the carrier wave frequency error before a receiving channel is switched, the error being detected by the detecting means; an estimating means (for example, a changed frequency error estimating part 96) for estimating a frequency error after a channel is switched based on a frequency error computed by the error computing means and a ratio between channel originating signal frequencies (for example, a second channel originating signal frequency $f_{LO}$) before and after a channel is changed in the case in which no frequency error occurs; and an initial value computing means (for example, a preset value computing part 97) for computing an initial value of a frequency in the demodulation process done by the demodulating means based on a frequency error after a receiving channel is switched, the error being estimated by the estimating means.

The control means may further include: an area setting means (for example, a search range setting part 131) for setting a search area in which a carrier wave frequency error contained in the IF signal is detected by means of the detecting means based on a frequency error after a receiving channel is switched, the error being estimated by the estimating means.

Figure 4:
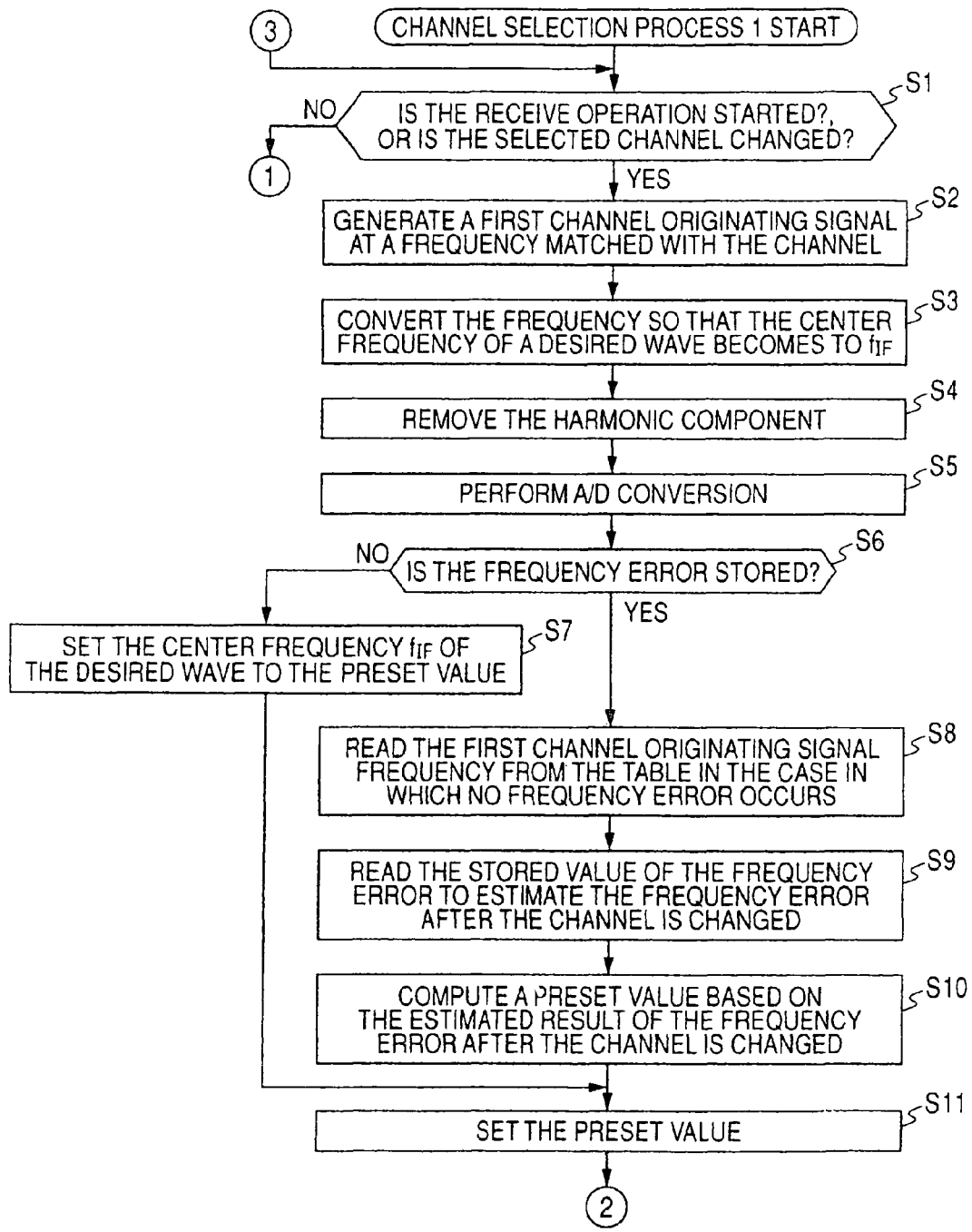
FIG. 4 shows a flow chart illustrative of channel selection process 1.
Figure 5:
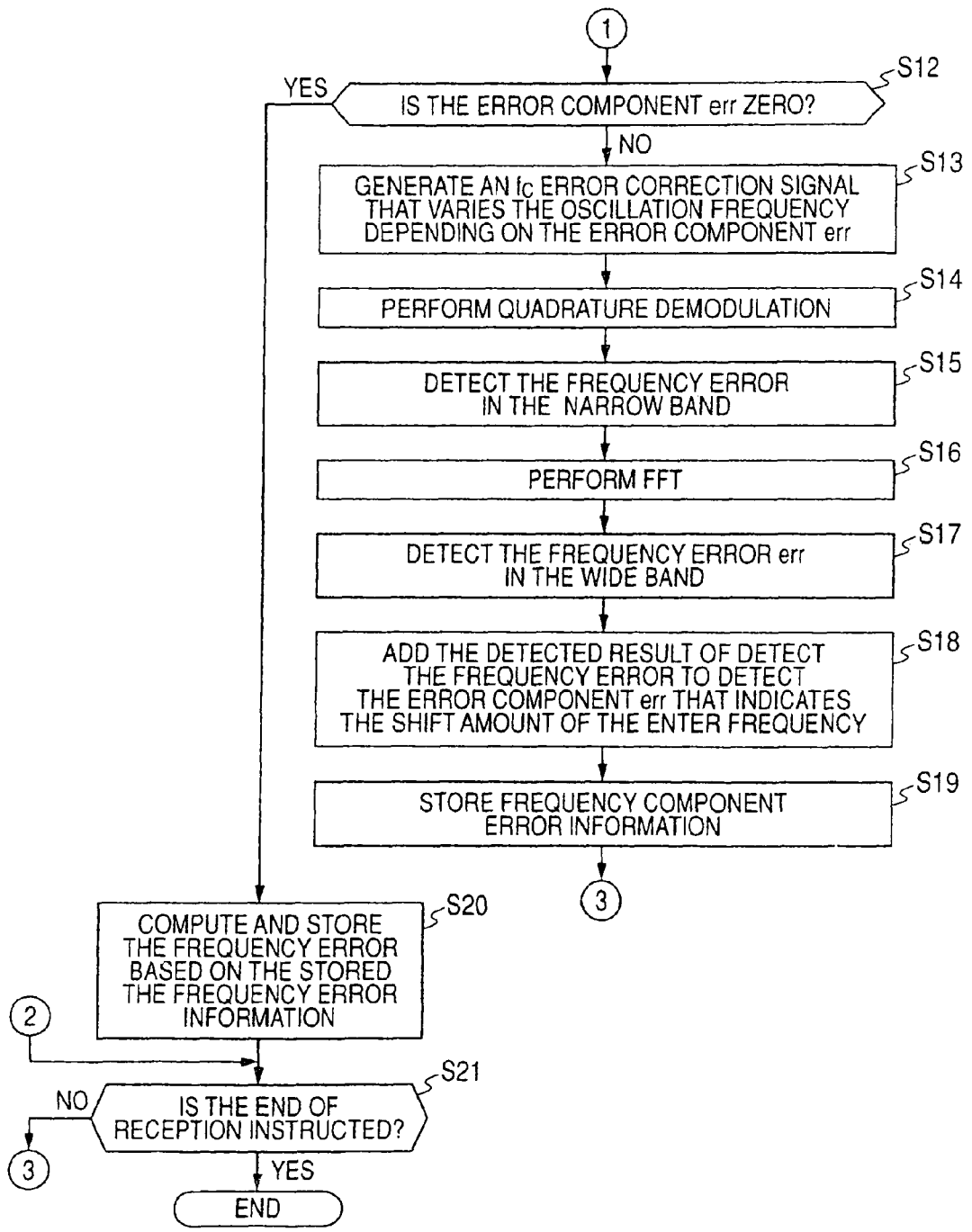
FIG. 5 shows a flow chart illustrative of channel selection process 1.
Figure 8:
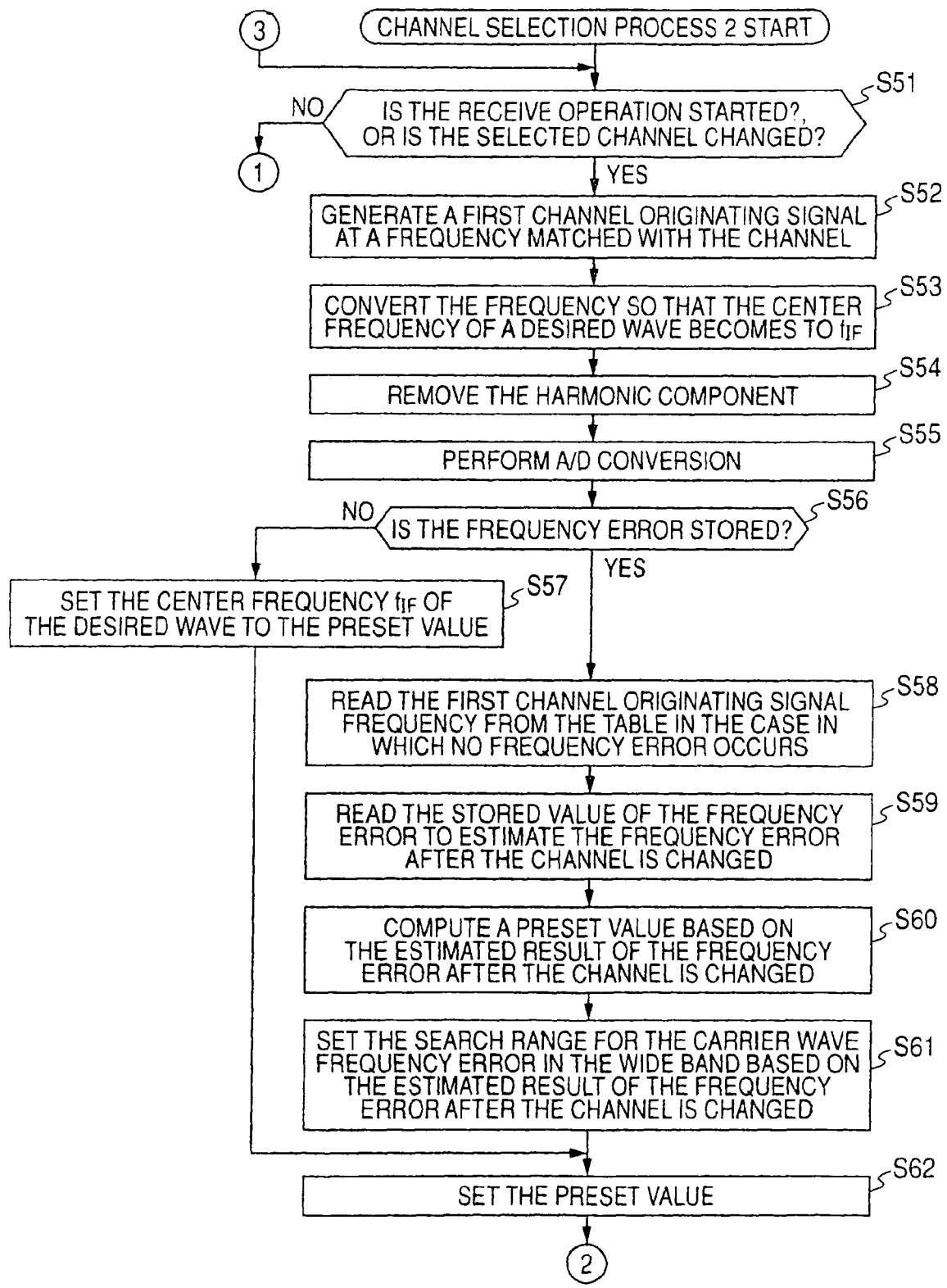
FIG. 8 shows a flow chart illustrative of channel selection process 2.
Figure 9:
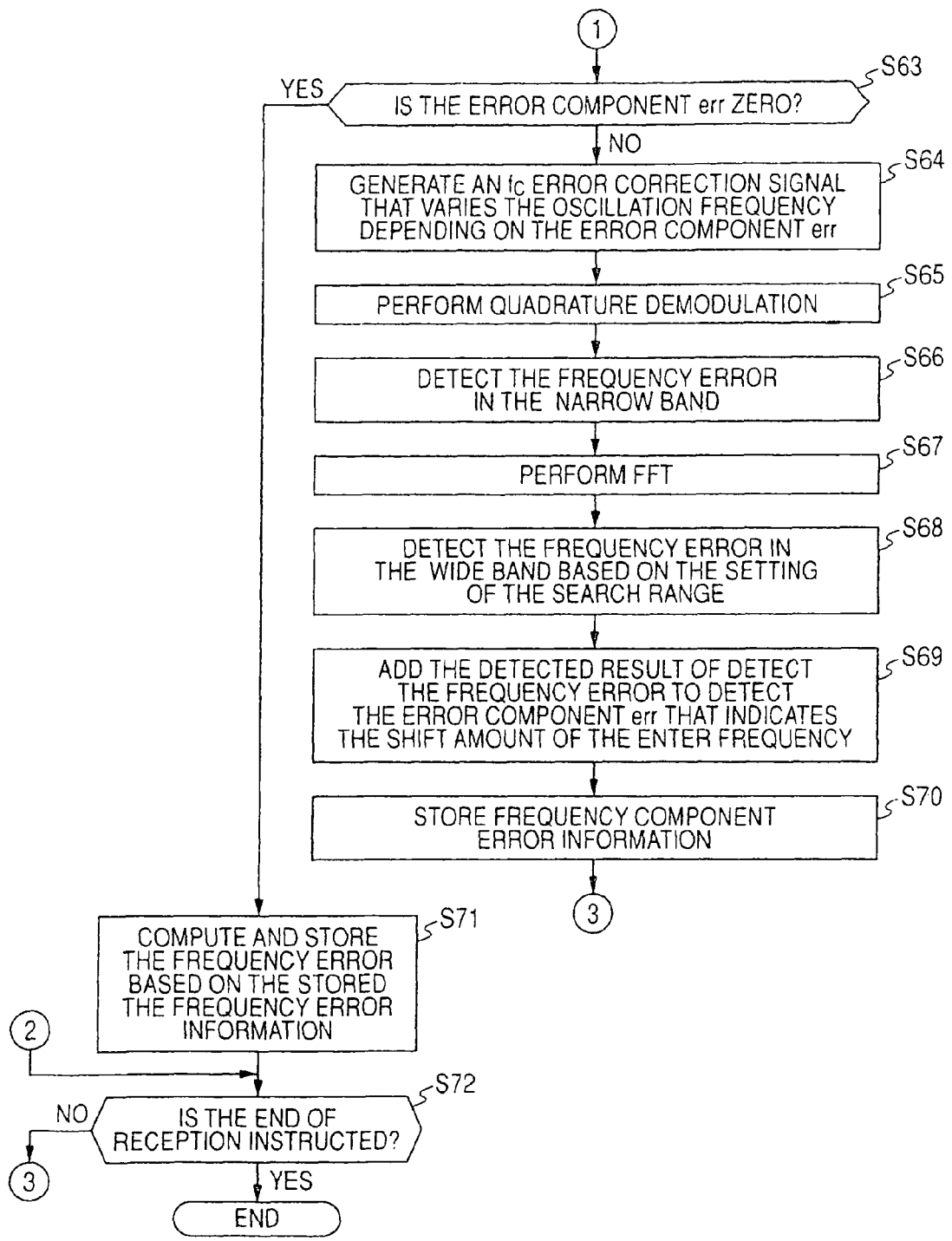
FIG. 9 shows a flow chart illustrative of channel selection process 2.

A receiving method according to an embodiment of the invention is a receiving method of a receiving apparatus which receives signals, the receiving method including the steps of: demodulating an IF signal obtained by subjecting a received RF signal to frequency conversion (for example, a process in Step S14 in FIG. 5, or in Step S65 in FIG. 9); detecting a carrier wave frequency error contained in the IF signal (for example, processes in Step S15 and Step S17 in FIG. 5, or in Step S66 and Step S68 in FIG. 9); correcting a frequency error of a frequency (for example, the oscillation frequency $f_{NCO}$) used for a demodulation process based on the detected carrier wave frequency error (for example, a process in Step S13 in FIG. 5, or in Step S64 in FIG. 9); and controlling a setting of an initial value (for example, a preset value) of a frequency in a demodulation process after a receiving channel is switched, based on the carrier wave frequency error before a receiving channel is switched, in the case in which a receiving channel is switched (for example, processes in Step S19 and Step S20 in FIG. 5, and in Step S8 to Step S11 in FIG. 4, or in Step S70 and Step S71 in FIG. 9, and in Step S58 to Step S60 and Step S62 in FIG. 8).

The step of controlling the setting of the initial value of the frequency in the demodulation process after a receiving channel is switched may include the step of estimating a frequency error after a receiving channel is switched based on the carrier wave frequency error before a receiving channel is switched (for example, a process in Step S9 in FIG. 4, or in Step S59 in FIG. 8).

The method may further include the step of setting a search area in which a carrier wave frequency error contained in the IF signal is detected based on an estimated frequency error after a receiving channel is switched (for example, a process in Step S61 in FIG. 8).

A program according to an embodiment of the invention is a program which can be executed by a computer that controls a reception process of a receiving apparatus having a functionality of detecting a carrier wave frequency error contained in an IF signal obtained by subjecting a received RF signal to frequency conversion to correct a frequency error, the program allowing the computer to execute a process including the steps of: computing a frequency error corresponding to the case in which an initial value of a frequency used for a demodulation process of the IF signal is a center frequency of a desired wave based on a detected result of a carrier wave frequency error contained in the IF signal before a receiving channel is switched in the case in which a receiving channel is switched (for example, processes in Step S19 and Step S20 in FIG. 5, or in Step S70 and Step S71 in FIG. 9); estimating a frequency error after a receiving channel is switched based on a computed frequency error and a ratio between channel originating signal frequencies (for example, the second channel originating signal frequency $f_{LO}$) before and after a channel is changed in the case in which no frequency error occurs (for example, a process in Step S9 in FIG. 4, or in Step S59 in FIG. 8); and controlling a setting of an initial value (for example, a preset value) of a frequency in a demodulation process after a receiving channel is switched based on an estimated result of a frequency error after a receiving channel is switched (processes in Step S10 and Step S11 in FIG. 4, or in Step S60 and Step S62 in FIG. 8).

The program may further include the step of setting a search area in which a carrier wave frequency error contained in the IF signal is detected based on an estimated frequency error after a receiving channel is switched (for example, a process in Step S61 in FIG. 8).

Hereinafter, an embodiment of the invention will be described with reference to the drawings.

Figure 2:
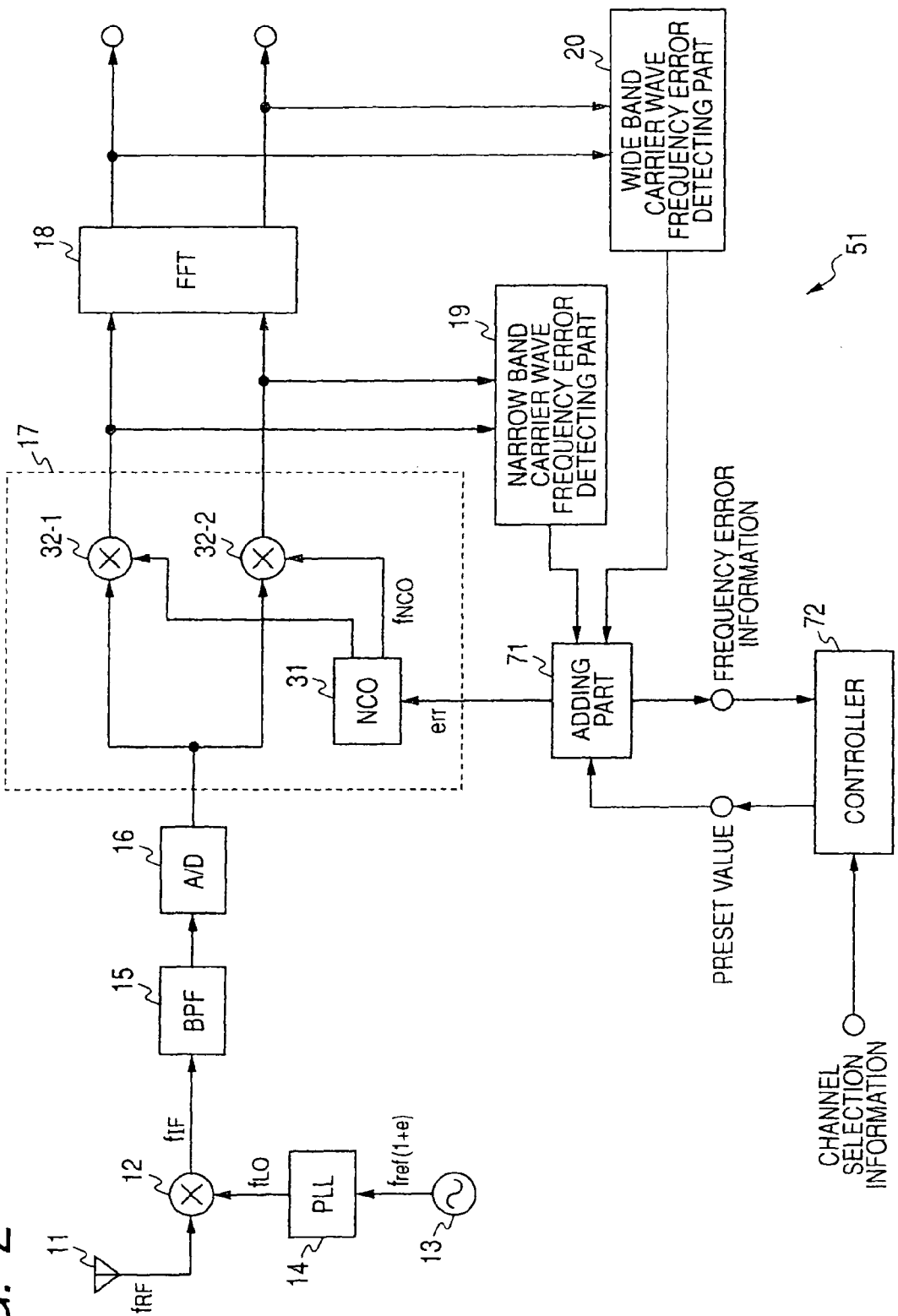
FIG. 2 shows a block diagram depicting the configuration of a receiving apparatus to which an embodiment of the invention is adapted.

FIG. 2 shows a block diagram depicting the configuration of a receiving apparatus 51.

In addition, the same numerals and signs are designated the portions corresponding to the apparatus before, properly omitting the descriptions.

In other words, the receiving apparatus 51 basically has the same configuration as that of the receiving apparatus 1 before described with reference to FIG. 1, except that an adding part 71 and a controller 72 are provided instead of the adding part 21 and the controller 22.

The adding part 71 adds the narrow band carrier frequency error component computed by a narrow band carrier wave frequency error detecting part 19 to the wide band carrier frequency error component computed by a wide band carrier wave frequency error detecting part 20 to compute the total shift amount of the center frequency of the base band OFDM signal. The adding part 71 supplies the computed total shift amount of the center frequency, that is, the frequency error information as the error component err to an NCO 31 as well as to the controller 72.

To the adding part 71, the controller 72 supplies the preset values of the oscillation frequencies of the NCO 31 in the first time reception operation after the power source of the receiving apparatus 1 is turned on and in the reception operation after the channel is changed. In the case in which the channel is changed, the controller 72 changes the preset value of the IF frequency based on the frequency error information supplied from the adding part 71 and channel selection information.

Figure 3:
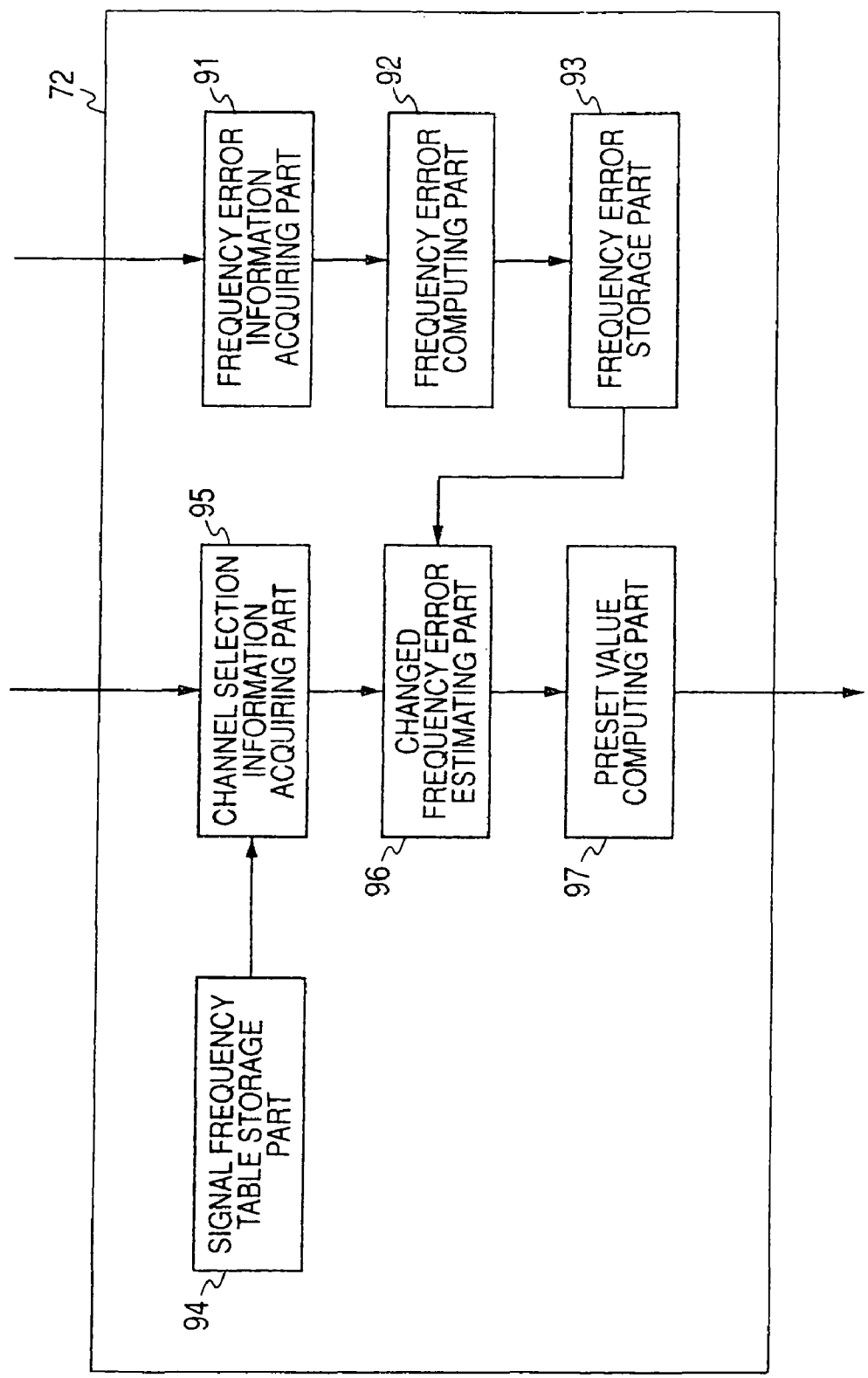
FIG. 3 shows a functional block diagram illustrative of the functionality of a controller shown in FIG. 2.

FIG. 3 shows a functional block diagram depicting the functionality of the controller 72 shown in FIG. 2.

The controller 72 have the following functionalities: a frequency error information acquiring part 91, a frequency error computing part 92, a frequency error storage part 93, a signal frequency table storage part 94, a channel selection information acquiring part 95, a changed frequency error estimating part 96, and a preset value computing part 97.

The frequency error information acquiring part 91 acquires frequency error information supplied from the adding part 71, and supplies the supplied frequency error information to the frequency error computing part 92 until no frequency error remains, that is, the oscillation frequency $f_{NCO}$ becomes stable.

After the oscillation frequency $f_{NCO}$ becomes stable, the frequency error computing part 92 computes a value $f_{errN'}$ corresponding to the frequency error $f_{errN}$ contained in the IF signal in the case in which the oscillation frequency of the NCO 31 is preset to the value expressed by $f_{NCO}=f_{IF}$ (N is a positive integer that is incremented every time when the channel is switched to stabilize the oscillation frequency $f_{NCO}$, where the point at which the power source is turned on is N=1) based on frequency error information supplied from the frequency error information acquiring part 91, and supplies it to the frequency error storage part 93.

In other words, the frequency errors detected by the narrow band carrier wave frequency error detecting part 19 and the wide band carrier wave frequency error detecting part 20 are the frequency errors for the current oscillation frequency $f_{NCO}$, which are the values that converge over time after the channel is changed. In contrast to this, the computed value $f_{errN'}$ for the frequency error is the value that is computed after the oscillation frequency $f_{NCO}$ becomes stable, indicating the value that the frequency error contained in the IF signal when the oscillation frequency of the NCO 31 is preset to the value expressed by $f_{NCO}=f_{IF}$ is computed based on the frequency error information supplied from the adding part 71 until the channel is changed to stabilize the oscillation frequency $f_{NCO}$.

The frequency error storage part 93 controls the storage of the computed value $f_{errN'}$ of the frequency error contained in the IF signal supplied from the frequency error computing part 92.

The signal frequency table storage part 94 stores the first channel originating signal frequency for every channel in the case in which no frequency error occurs.

The channel selection information acquiring part 95 acquires channel selection information. In the case in which the channel is changed, it reads the first channel originating signal frequencies in the case in which no frequency error occurs before and after the channel is changed out of the signal frequency table storage part 94, and supplies them to the changed frequency error estimating part 96.

When the changed frequency error estimating part 96 receives information about the first channel originating signal frequencies in the case in which no frequency error occurs before and after the channel is changed from the channel selection information acquiring part 95, it determines whether the frequency error storage part 93 stores the computed value $f_{errN'}$ of the frequency error contained in the IF signal before the channel is changed.

In the case in which the changed frequency error estimating part 96 stores the computed value $f_{errN'}$ of the frequency error contained in the IF signal before the channel is changed, it reads the computed value $f_{errN'}$ of the frequency error contained in the IF signal before the channel is changed, estimates the frequency error after the channel is changed, and supplies it to the preset value computing part 97.

In addition, in the case in which the changed frequency error estimating part 96 does not store the computed value $f_{errN'}$ of the frequency error contained in the IF signal before the channel is changed, that is, in the case in which the oscillation frequency $f_{NCO}$ has never reached the stable state because the apparatus is right after the power source is turned on, or because the channels are kept switched quickly after the power source is turned on, the changed frequency error estimating part sends notice to the preset value computing part 97 that the oscillation frequency $f_{NCO}$ of the NCO 31 is preset to $f_{IF}$ as in the case of Equation (2), as similar to the case before.

The preset value computing part 97 computes the preset value based on the notice from the changed frequency error estimating part 96, or the estimated value of the frequency error after the channel is changed, and supplies it to the adding part 71.

More specifically, for example, in the case in which the oscillation frequency $f_{NCO}$ has never reached the stable state because the apparatus is right after the power source is turned on, or because the channel is kept switched quickly after the power source is turned on, the oscillation frequency $f_{NCO}$ of the NCO 31 is preset to $f_{IF}$ as in the case of Equation (2), as similar to the case before. In contrast to this, in the case in which the oscillation frequency $f_{NCO}$ has reached the stable state before the channel is changed, the preset value is computed in consideration of the estimated value of the frequency error after the channel is changed, and supplied to the adding part 71.

Then, the narrow band carrier wave frequency error detecting part 19 and the wide band carrier wave frequency error detecting part 20 detect frequency errors, and supply them to the adding part 71. The adding part 71 supplies the error component err to the NCO 31 of the orthogonal demodulating part 17 until the oscillation frequency $f_{NCO}$ is stabilized to $f_{IF1}$, that is, until the error component err is zero as well as supplies frequency error information to the frequency error information acquiring part 91 of the controller 72.

After the oscillation frequency $f_{NCO}$ is stabilized, the frequency error computing part 92 computes the value $f_{errN'}$ corresponding to the frequency error $f_{errN}$ contained in the IF signal in the case in which the oscillation frequency of the NCO 31 is preset to the value expressed by $f_{NCO}=f_{IF}$ based on the frequency error information supplied from the frequency error information acquiring part 91, and supplies and stores it in the frequency error storage part 93.

In the case in which it is instructed to change the channel, the first channel originating signal frequency $f_{LO2}$ with no frequency error is theoretically the following Equation (6), where the RF signal center frequency of the selected channel after the channel is changed is $f_{RF2}$.

$$f_{LO2}=f_{RF2}+f_{IF} \quad (6)$$

In consideration of the frequency error of the reference signal, the oscillation frequency of the first channel originating signal is the following Equation (7), the frequency error is expressed by the following Equation (8), and the center frequency of the IF signal with a frequency error is expressed by the following Equation (9).

$$f_{LO2(1+e)}=f_{LO2}+e \times f_{LO2} \quad (7)$$

$$f_{err2}=e \times f_{LO2} \quad (8)$$

$$f_{if2}=f_{IF}+e \times f_{LO2} \quad (9)$$

Since the frequency error is equal to the frequency error contained in the IF signal, the base band signal with no frequency error can be obtained when the oscillation frequency of the NCO 31 is Equation (9).

As described above, to the NCO 31 and the controller 72, the adding part 71 supplies frequency error information corresponding to information that instructs whether the originating frequency should be raised or dropped until the oscillation frequency of the NCO 31 becomes stable.

Before and after the channel is changed, the frequency error of the reference signal rarely occurs. Therefore, in the case in which it is instructed to change the channel, the channel selection information acquiring part 95 reads the first channel originating signal frequencies $f_{LO1}$ and $f_{LO2}$ before and after the channel is changed in the case in which no frequency error occurs out of the signal frequency table storage part 94, and supplies them to the changed frequency error estimating part 96.

The changed frequency error estimating part 96 acquires information about the first channel originating signal frequencies before and after the channel is changed in the case in which no frequency error occurs from the channel selection information acquiring part 95, reads the computed value $f_{err1'}$ of the frequency error contained in the IF signal before the channel is changed out of the frequency error storage part 93, and estimates the frequency error after the channel is changed based on the following Equation (10).

$$f_{err2'}=f_{err1'} \times f_{LO2}/f_{LO1} \quad (10)$$

As expressed by Equation (10), the estimated value $f_{err2'}$ of the frequency error after the channel is changed that corresponds to the frequency error $f_{err2}$ after the channel is changed that is expressed by Equation (8) can be obtained by estimation based on the computed value $f_{err1'}$ of the frequency error contained in the IF signal before the channel is changed, and the first channel originating signal frequencies before and after the channel is changed in the case in which no frequency error occurs.

Then, the preset value computing part 97 uses the following Equation (11) to compute the preset frequency after the channel is changed, and supplies it to the adding part 71.

$$f_{IF2}=f_{IF}+f_{err2'} \quad (11)$$

For example, the maximum frequency error of an inexpensive crystal oscillator is about 50 ppm. In the case of using a crystal oscillator like this, it is likely that it is necessary to tune a frequency in consideration of the frequency drift of about 50 ppm in the worst case. In contrast to this, as described above, a frequency error is estimated to set a preset value, whereby it is possible to tune a frequency from a frequency drift of about a few ppm.

Performing the process like this allows starting carrier wave synchronization with a small carrier wave frequency error. Therefore, a time to achieve synchronization can be greatly reduced.

After that, the case in which it is instructed to change the channel, the preset frequency is similar determined and supplied to the adding part 71.

Next, channel selection process 1 done by the receiving apparatus 51 will be described with reference to flow charts shown in FIGS. 4 and 5.

In Step S1, the controller 72 determines whether the reception operation is started, or the selected channel is changed, that is, the channel select operation is started. Step S1, if it is determined that the selected channel is not changed, the process goes to Step S12, described later.

In Step S1, if it is determined that the reception operation is started, or the selected channel is changed, in Step S2, the PLL 14 generates the first channel originating signal at the frequency matched with the channel, and supplies it to the mixer 12.

In Step S3, the mixer 12 performs frequency conversion so that the center frequency of the desired wave becomes $f_{IF}$, and supplies it to the bandpass filter 15.

In Step S4, the bandpass filter 15 removes the harmonic component from the supplied signal, and supplies the signal to the A/D converting part 16.

In Step S5, the A/D converting part 16 subjects the signal to A/D conversion, and supplies it to the orthogonal demodulating part 17.

In Step S6, the changed frequency error estimating part 96 of the controller 72 determines whether the frequency error storage part 93 stores the computed value $f_{errN'}$ of the frequency error contained in the IF signal before the channel is changed.

In Step S6, if it is determined that the computed value $f_{errN'}$ of the frequency error contained in the IF signal before the channel is changed is not stored, in Step S6, the changed frequency error estimating part 96 of the controller 72 sends a notice to the preset value computing part 97 that the center frequency of the desired wave $f_{IF}$ is the preset value. The preset value computing part 97 supplies the center frequency $f_{IF}$ of the desired wave as the preset value to the adding part 71, and the process goes to Step S11, described later.

In Step S6, if it is determined that the computed value $f_{errN'}$ of the frequency error contained in the IF signal before the channel is changed is stored, in Step S8, the channel selection information acquiring part 95 of the controller 72 acquires channel selection information, reads the first channel originating signal frequencies before and after the channel is changed in the case in which no frequency error occurs out of the signal frequency table storage part 94, and supplies them to the changed frequency error estimating part 96.

In Step S9, the changed frequency error estimating part 96 of the controller 72 reads the computed value $f_{errN'}$ of the frequency error stored in the frequency error storage part 93, and uses Equation (10) described above to estimate the frequency error after the channel is changed.

In Step S10, the preset value computing part 97 of the controller 72 uses Equation (11) described above to compute the preset value based on the estimated result of the frequency error after the channel is changed, and supplies it to the adding part 71.

After the process in Step S7, or in Step S10 is finished, in Step S11, the adding part 71 sets a preset value, and the process goes to Step S21, described later.

In Step S1, if it is determined that the selected channel is not changed, in Step S12, the NCO 31 determines whether the error component err is zero in frequency component error information supplied from the adding part 71. In Step S12, if it is determined that the error component err is zero, the process goes to Step S20, described later.

In Step S12, if it is determined that the error component err is not zero, in Step S13, the NCO 31 generates the fc error correction signal in which the oscillation frequency fluctuates in accordance with the error component err, and supplies it to the multiplying parts 32-1 and 32-2.

In Step S14, the multiplying parts 32-1 and 32-2 perform orthogonal demodulation for the received signal supplied.

In Step S15, the narrow band carrier wave frequency error detecting part 19 detects the narrow band carrier frequency error component, that is, the narrow band frequency error that indicates the shift amount of the center frequency of the OFDM time domain signal after orthogonal demodulation by the orthogonal demodulating part 17.

In Step S16, the FFT computing part 18 subjects the OFDM time domain signal to FFT computation.

In Step S17, for the OFDM frequency domain signal after FFT computation, the wide band carrier wave frequency error detecting part 20 detects the wide band carrier frequency error component that indicates the shift amount of the center frequency of the OFDM time domain signal, that is, the wide band frequency error.

In Step S18, the adding part 71 adds the narrow band carrier frequency error component computed by the narrow band carrier wave frequency error detecting part 19 to the wide band carrier frequency error component computed by the wide band carrier wave frequency error detecting part 20, that is, it adds the detected results of the frequency errors, the total shift amount of the center frequency of the base band OFDM signal is computed, the error component err that indicates the shift amount of the center frequency is detected, and supplies it to the NCO 31 and the controller 72.

In Step S19, the frequency error information acquiring part 91 of the controller 72 supplies frequency component error information supplied from the adding part 71 to the frequency error computing part 92. The frequency error computing part 92 stores the supplied frequency component error information, the process returns to Step S1, and the process steps after that are repeated.

In Step S12, if it is determined that the error component err is zero, Step S20, the frequency error computing part 92 of the controller 72 computes the computed value $f_{errN'}$ of the frequency error based on the stored frequency error information, and supplies it to the frequency error storage part 93. The frequency error computed at this time corresponds to $f_{err1}$, in Equation (10) in the case in which the subsequent estimated value of the frequency error after the channel is changed is $f_{err2}$, for example. The frequency error storage part 93 controls the storage of the estimated value $f_{errN'}$ of the frequency error contained in the IF signal supplied from the frequency error computing part 92.

After the process in Step S11 or in Step S20 is finished, in Step S21, the controller 72 determines whether it is instructed to end reception.

In Step S21, if it is determined that it is not instructed to end reception, the process returns to Step S1, and the process steps after that are repeated. In Step S21, if it is determined that it is instructed to end reception, the process is ended.

According to this process, in the case in which the selected channel is changed, the frequency error is estimated based on Equation (10) described above, and the preset value is set based on Equation (11) described above. Therefore, carrier wave synchronization can be started with a small carrier wave frequency error.

In addition, when the estimated value of the frequency error is used not only for the preset value but also for setting the search area of the detection process for the frequency error, it is unnecessary to widely set the search area for errors in consideration of the amount of the occurrence of frequency errors. Therefore, it is preferable because the detection speed of errors becomes faster.

Figure 6:
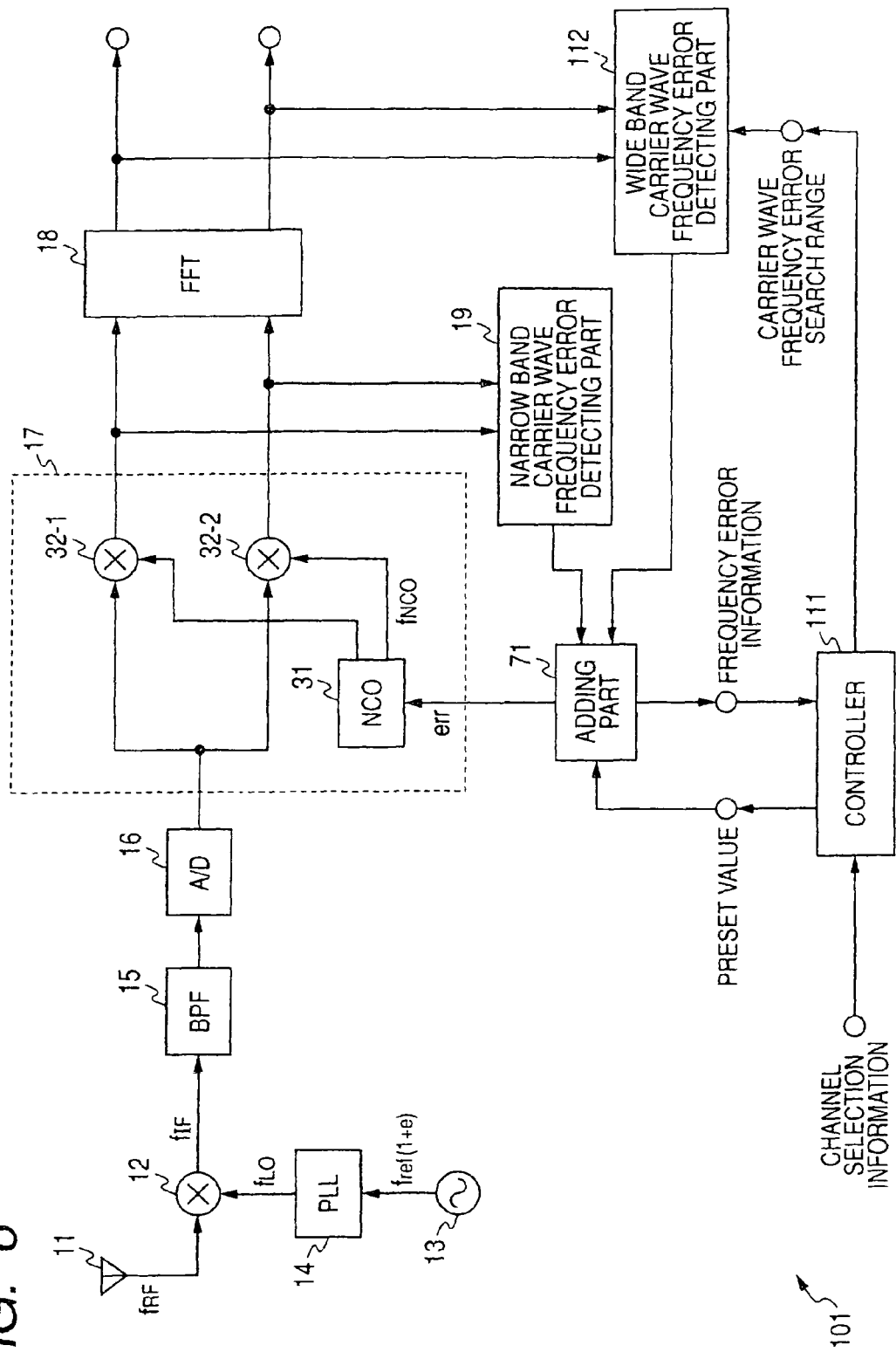
FIG. 6 shows a block diagram depicting the configuration of a receiving apparatus to which an embodiment of the invention is adapted.

FIG. 6 shows a block diagram depicting the configuration of a receiving apparatus 101 in which the estimated value of the frequency error is used not only for the preset value but also for setting the search area of the detection process for frequency errors.

In addition, the portions corresponding to those of the apparatus before, or those of the receiving apparatus 51 described with reference to FIG. 2 are designated the same numerals and signs, properly omitting the descriptions.

In other words, the receiving apparatus 101 basically has the same configuration as that of the receiving apparatus 51 described with reference to FIG. 2 except that a controller 111 is provided instead of the controller 72 and a wide band carrier wave frequency error detecting part 112 is provided instead of the wide band carrier wave frequency error detecting part 20.

As similar to the controller 72 of the receiving apparatus 51, to an adding part 71, the controller 111 supplies the preset values of the oscillation frequencies of the NCO 31 in the first time reception operation after the power source of the receiving apparatus 1 is turned on and in the reception operation after the channel is changed. In the case in which the channel is changed, the controller also estimates a frequency error based on the frequency error information supplied from the adding part 71 and channel selection information, and changes the preset value of the IF frequency based on the estimated value. Moreover, the controller 111 sets the search area for the frequency error detection operation done by the wide band carrier wave frequency error detecting part 112 based on the estimated value of the frequency error.

As similar to the wide band carrier wave frequency error detecting part 20 of the receiving apparatus 51, the wide band carrier wave frequency error detecting part 112 computes the wide band carrier frequency error component that indicates the shift amount of the center frequency of the OFDM time domain signal for the OFDM frequency domain signal after FFT computation. At this time, it sets the search area for a the CP signal extracting process for the OFDM frequency domain signal after FFT computation based on control done by the controller 111, performs differential demodulation for two times between symbols in the search area to extract a CP signal, and computes how the subcarrier position of the extracted CP signal is shifted from the original subcarrier position, where by it computes the carrier frequency error component of the OFDM signal.

As described above, a frequency error sometimes occurs in the PLL reference signal that is supplied from the PLL 14 to the mixer 12 depending on the accuracy of the crystal oscillator used in the local oscillator 13. Therefore, in the receiving apparatus 1 before described with reference to FIG. 1 or the receiving apparatus 51 described with reference to FIG. 2, it is necessary to set a wider search area for detecting the wide band carrier wave frequency error in consideration of the amount of the occurrence of frequency errors.

As described above, for example, the maximum frequency error of an inexpensive crystal oscillator is about 50 ppm. In the case of using a crystal oscillator like this, it is likely that it is necessary to tune a frequency in consideration of the frequency drift of about 50 ppm in the worst case.

In contrast to this, in the wide band carrier wave frequency error detecting part 112 of the receiving apparatus 101, it is unnecessary to set a wider search area for errors in consideration of the amount of the occurrence of frequency errors. Thus, it is preferable because the detection speed of errors is faster.

Figure 7:
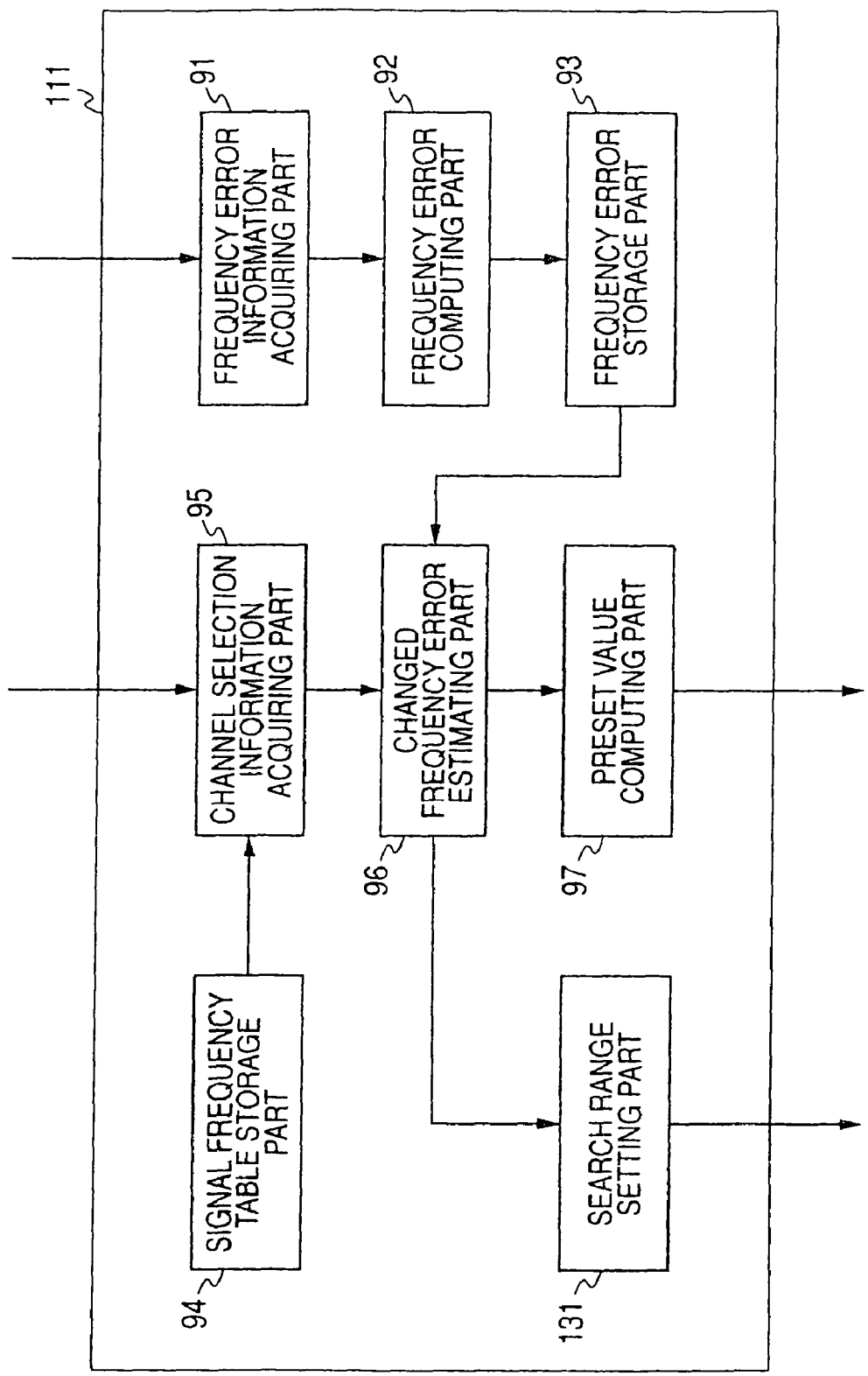
FIG. 7 shows a functional block diagram illustrative of the functionality of a controller shown in FIG. 6.

FIG. 7 shows a functional block diagram depicting the functionality of the controller 111 shown in FIG. 6.

In addition, the same numerals and signs are designated the portions corresponding to those of the controller 72 of the receiving apparatus 51 described with reference to FIG. 3, properly omitting the descriptions.

In other words, the controller 111 basically has the same functionalities as those of the controller 71 except that it newly has the functionality of a search range setting part 131.

The search range setting part 131 sets the search area for the frequency error detection operation done by the wide band carrier wave frequency error detecting part 112 based on the estimated value of the frequency error after the channel is changed, the value being supplied from a changed frequency error estimating part 96.

Next, channel selection process 2 done by the receiving apparatus 101 will be described with reference to flow charts shown in FIGS. 8 and 9.

In Step S51 to Step S60, basically the same process steps as those in Step S1 to Step S10 in FIG. 4 are performed.

In other words, it is determined whether the reception operation is started, or the selected channel is changed, that is, the channel select operation is started. If it is determined that the selected channel is not changed, the process goes to Step S63, described later.

If it is determined that the reception operation is started, or the selected channel is changed, the first channel originating signal at the frequency matched with the channel is generated to perform frequency conversion so that the center frequency of the desired wave is $f_{IF}$, and the harmonic component is removed from the signal for A/D conversion.

Then, it is determined whether the frequency error storage part 93 stores the computed value $f_{errN'}$ of the frequency error contained in the IF signal before the channel is changed. If it is determined that the value is not stored, the center frequency of the desired wave $f_{IF}$ is set to the preset value.

If it is determined that the computed value $f_{errN'}$ of the frequency error is stored, the first channel originating signal frequencies before and after the channel is changed in the case in which no frequency error occurs are read out of the signal frequency table storage part 94 as well as the stored value of the frequency error is read out of the frequency error storage part 93, Equation (10) described above is used to estimate the frequency error after the channel is changed, Equation (11) described above is used to compute the preset value based on the estimated result of the frequency error after the channel is changed, and the preset value is supplied to the adding part 71.

In Step S61, the search range setting part 131 sets the search area for the wide band carrier wave frequency error performed in the wide band carrier wave frequency error detecting part 112 based on the estimated result of the frequency error after the channel is changed that is estimated in Step S59.

In Step S62 to Step S67, basically the same process steps as those in Step S11 in FIG. 4 and in Step S16 in FIG. 5 are performed.

In other words, the preset value computed in Step S60 is set, and the process goes to Step S72, described later.

Then, in Step S51, if it is determined that the selected channel is not changed, it is determined whether the error component err is zero in the frequency component error information supplied from the adding part 71. If it is determined that the error component err is not zero, the fc error correction signal in which the oscillation frequency fluctuates in accordance with the error component err is generated, and orthogonal demodulation is performed for the received signal supplied.

Then, the narrow band carrier frequency error component that indicates the shift amount of the center frequency of the OFDM time domain signal after orthogonal demodulation, that is, the narrow band frequency error is detected, and FFT computation is performed for the OFDM time domain signal.

In Step S68, the wide band carrier wave frequency error detecting part 112 detects the wide band carrier frequency error component that indicates the shift amount of the center frequency of the OFDM time domain signal, that is, the wide band frequency error for the OFDM frequency domain signal after FFT computation based on the setting of the search area performed in Step S61.

In Step S69, the adding part 71 adds the narrow band carrier frequency error component computed by the narrow band carrier wave frequency error detecting part 19 to the wide band carrier frequency error component computed by the wide band carrier wave frequency error detecting part 112, that is, the detected results of the frequency errors, the total shift amount of the center frequency of the base band OFDM signal is computed, the error component err that indicates the shift amount of the center frequency is detected, and supplies it to the NCO 31 and to the controller 111.

In Step S70, the frequency error information acquiring part 91 of the controller 111 supplies the frequency component error information supplied from the adding part 71 to the frequency error computing part 92. The frequency error computing part 92 stores the supplied frequency component error information, the process returns to Step S51, and the process steps after that are repeated.

In Step S63, if it is determined that the error component err is zero, in Step S71, the frequency error computing part 92 of the controller 111 computes the frequency error based on the stored frequency error information, and supplies it to the frequency error storage part 93. The frequency error computed at this time corresponds to $f_{err1}$, in Equation (10). The frequency error storage part 93 controls the storage of the computed value $f_{errN'}$ of the frequency error contained in the IF signal that is supplied from the frequency error computing part 92.

After the process in Step S62 or Step S71 is finished, in Step S72, the controller 111 determines whether it is instructed to end reception.

In Step S72, if it is determined that it is not instructed to end reception, the process returns to Step S51, and the process steps after that are repeated. In Step S72, if it is determined that it is instructed to end reception, the process is ended.

According to this process, in the case in which the selected channel is changed, the frequency error is estimated based on Equation (10) described above, and the preset value is set based on Equation (11) described above. Therefore, carrier wave synchronization can be started with a small carrier wave frequency error, and the estimated value of the frequency error is used for the setting of the search area of the detection process for the frequency error to set the error search area narrower, whereby it is preferable because the detection speed of errors becomes faster.

In the discussion above, OFDM modulation is taken and described as an example. An embodiment of the invention is applicable to an apparatus that uses pattern matching to search for frequency errors, and it is applicable to the case in which the search process is performed for frequency errors.

In other words, an embodiment of the invention is applicable in a receiver that converts the RF signal into the IF signal or the base band signal for demodulation, or in a receiving apparatus in which the range of the carrier wave frequency error included in the IF signal or the base band signal exceeds the tuning range of a carrier wave synchronization circuit.

Figure 10:
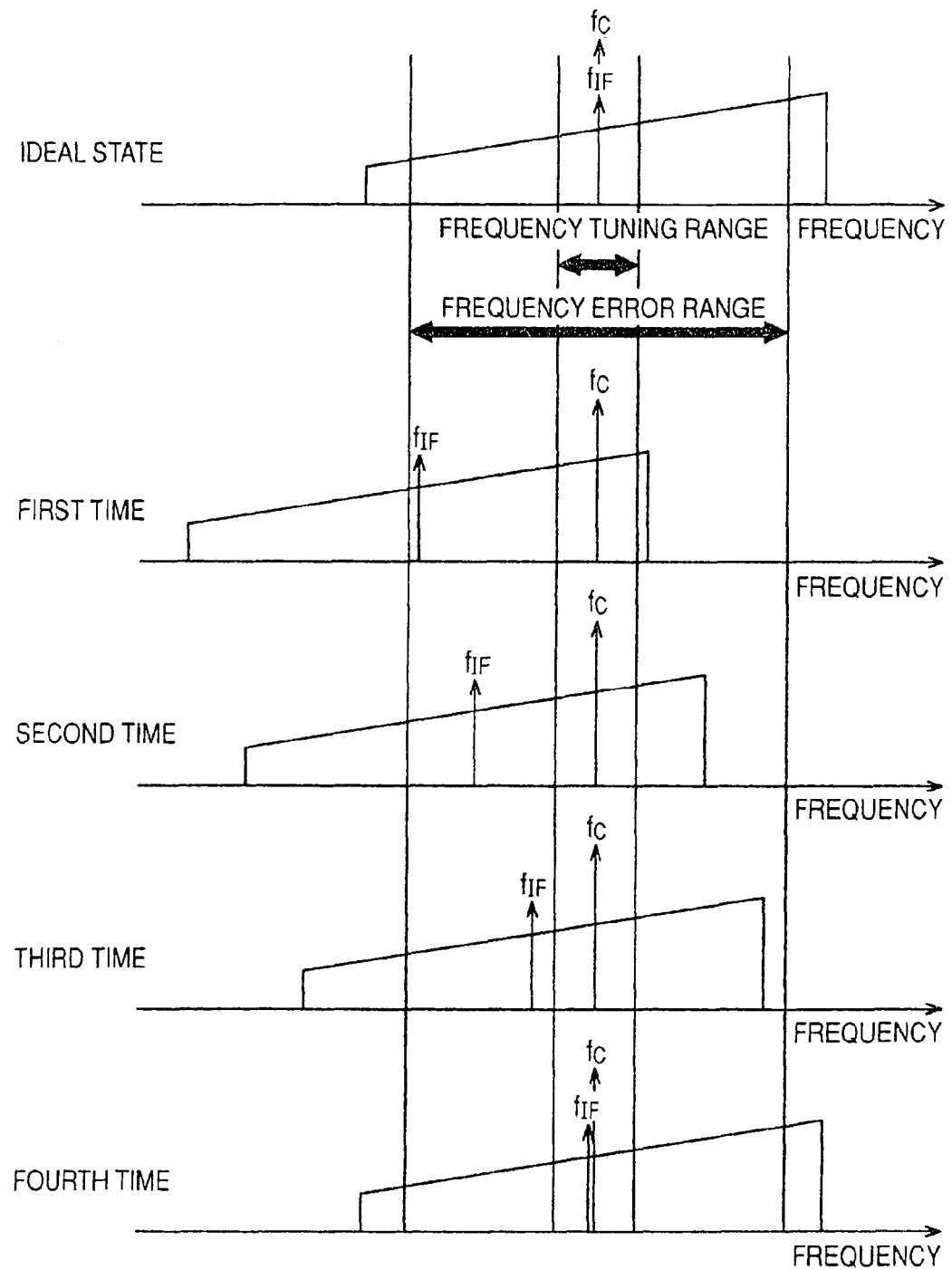
FIG. 10 shows a diagram illustrative of a search process having a frequency error.

For example, as shown in FIG. 10, the ideal state is the state in which the frequency fc that is the center of the frequency tuning range is matched with the center frequency $f_{IF}$ of the carrier wave. However, in the case in which the range of the carrier wave frequency error contained in the IF signal or the base band signal exceeds the tuning range of the carrier wave synchronization circuit, in the first time detection, it is likely that the center frequency $f_{IF}$ of the carrier wave is not included in the frequency tuning range. In this case, the frequency error is detected, the oscillation frequency of the local oscillator signal is varied based on the detected result until the frequency error is within the tuning range of the carrier wave synchronization circuit, and the correction of the frequency fc that is the center of the frequency tuning range is performed for a plurality of times (for example, four times in FIG. 10), whereby carrier wave synchronization can be established.

As described above, in the receiving apparatus or the transmitter-receiver apparatus in which the RF signal is converted into the IF signal or the base band signal for demodulation, or in the information processing apparatus having the signal receiving and sending functionality, or in the receiving apparatus having the range of the carrier wave frequency error contained in the IF signal, or the base band signal that exceeds the tuning range of the carrier wave synchronization circuit, when an embodiment of the invention is applied to start carrier wave synchronization with a small carrier wave frequency error to allow a great reduction in a time to achieve synchronization.

In other words, in various apparatuses having the functionality of converting the RF signal into the IF signal or the base band signal for demodulation, an embodiment of the invention is applied to estimate the carrier wave frequency error after the channel is switched from the computed value of the carrier wave frequency error before the channel is switched and to set the preset value based on the estimated result. Therefore, the frequency range of drawing the carrier wave is allowed in the narrow band, that is, the range of computing correlation to be narrowed, and the synchronization time in switching the receiving channel can be shortened.

In addition, an embodiment of the invention is applied to narrow the capture range of the carrier wave frequency error based on the estimated result of the carrier wave frequency error after the channel is switched. Therefore, it is preferable because the detection speed of frequency errors is faster.

A series of the process steps described above may be performed by software. A program configuring the software is installed in a computer incorporated in a dedicated hardware, or is installed from a recording medium to a multi-purpose personal computer, for example, that can run various functions by installing various programs. In this case, for example, the receiving apparatus 51 described with reference to FIG. 2, or the receiving apparatus 101 described with reference to FIG. 6 is configured of a personal computer 301 shown in FIG. 11.

Figure 11:
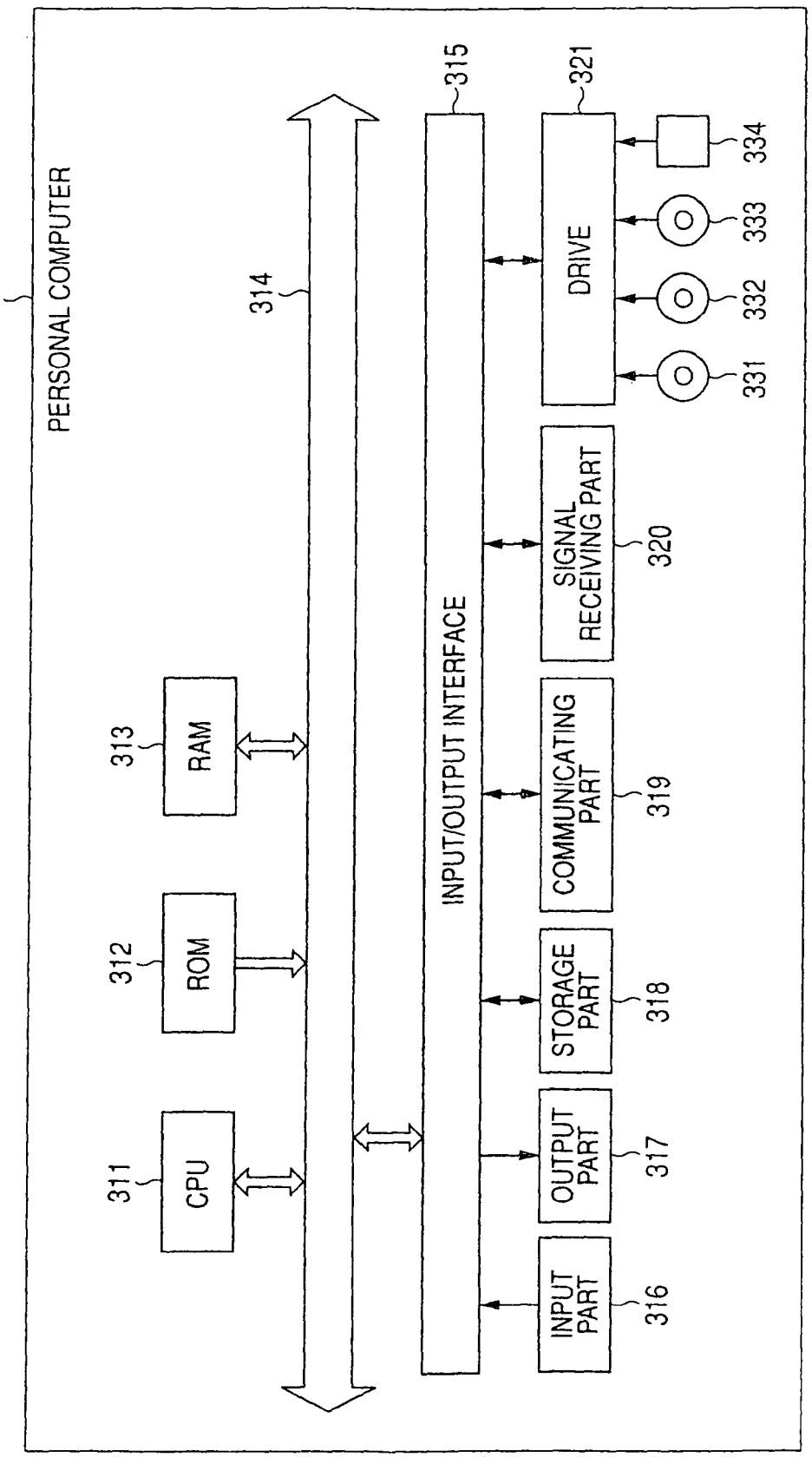
FIG. 11 shows a block diagram depicting the configuration of a personal computer.

In FIG. 11, a CPU (Central Processing Unit) 311 performs various processes in accordance with a program stored in a ROM (Read Only Memory) 312, or a program loaded from a storage part 318 to a RAM (Random Access Memory) 313. In the RAM 313, such data is properly stored that is necessary to perform various processes by the CPU 311.

The CPU 311, the ROM 312, and the RAM 313 are connected to each other through a bus 314. To the bus 314, an input/output interface 315 is also connected.

To the input/output interface 315, an input part 316 which is formed of a keyboard and a mouse, an output part 317 which is formed of a display and a speaker, the storage part 318 which is formed of a hard disk, a communicating part 319 which is formed of a modem and a terminal adopter, and a signal receiving part 320 are connected. The communicating part 319 performs communication processes through a network including the Internet.

The signal receiving part 320 has the antenna 11, the mixer 12, the local oscillator 13, the PLL 14, the bandpass filter 15, the A/D converting part 16, the orthogonal demodulating part 17, and the FFT computing part 18 described with reference to FIG. 2 or FIG. 6, or is configured to perform the similar functionalities, which performs the similar processes as those described above based on control done by the CPU 311 having the functionality of the controller 72 described with reference to FIG. 2, or the controller 111 described with reference to FIG. 6. In addition, the functionality of the narrow band carrier wave frequency error detecting part 19, the wide band carrier wave frequency error detecting part 20, or the wide band carrier wave frequency error detecting part 112 may be provided to the CPU 311, or may be provided to the signal receiving part 320.

To the input/output interface 315, a drive 321 is connected as necessary, and a magnetic disk 331, an optical disk 332, a magneto-optical disk 333, or a semiconductor memory 334 is properly mounted. A computer program read out thereof is installed in the storage part 318 as necessary.

In the case in which a series of the process steps is executed by software, a program configuring the software is installed in a computer incorporated in a dedicated hardware, or is installed through a network, or from a recording medium to a multi-purpose personal computer, for example, that can run various functions by installing various programs.

As shown in FIG. 11, separately from the apparatus main body, the recording medium is configured of a package medium that is distributed to supply a program to users on which the program is stored such as the magnetic disk 331 (including a floppy disk), the optical disk 332 (including CD-ROM (Compact Disk-Read Only Memory) and DVD (Digital Versatile Disk)), the magneto-optical disk 333 (including MD (Mini-Disk) (trademark)), or the semiconductor memory 334, as well as configured of the ROM 312 on which the program is stored and a hard disk in the storage part 318, they are supplied to users as mounted on the apparatus main body in advance.

In addition, in the specification, the steps describing the program to be recorded on the recording medium of course include the process steps performed in time series along the described order and also include the process steps performed individually or in parallel not necessarily processed in time series.

Moreover, an embodiment of the invention is not limited to the embodiment described above, which can be modified within the scope not deviating from the teaching of an embodiment of the invention.

It should be understood by those skilled in the art that various modifications, combinations, sub-combinations and alterations may occur depending on design requirements and other factors insofar as they are within the scope of the appended claims or the equivalents thereof.

What is claimed is:

1. A receiving apparatus comprising:
a demodulating means for demodulating an IF signal obtained by subjecting a received RF signal to frequency conversion;
a detecting means for detecting a carrier wave frequency error contained in the IF signal;
a frequency control means for setting an initial value of a frequency used in the demodulation process done by the demodulating means and for correcting a frequency error of the frequency used for the demodulation process done by the demodulating means based on the carrier wave frequency error detected by the detecting means; and
a control means for controlling the setting of the initial value of the frequency used in the demodulation process done by the demodulating means by means of the frequency control means after a receiving channel is switched, based on the carrier wave frequency error before the receiving channel is switched,
the initial value of the frequency is set by adding an IF signal frequency error to a desired IF signal frequency, and the IF signal frequency error is computed by multiplying the carrier wave frequency error before the receiving channel is switched by a ratio of frequencies.

2. The receiving apparatus according to claim 1, wherein the control means further comprises:
an area setting means for setting a search area in which the carrier wave frequency error contained in the IF signal is detected by means of the detecting means based on the frequency error after the receiving channel is switched, the error being estimated by the estimating means.

3. The receiving apparatus according to claim 1, wherein the detecting means detects the carrier wave frequency error contained in the IF signal by pattern matching.

4. The receiving apparatus according to claim 1, wherein the detecting means detects the carrier wave frequency error contained in the IF signal based on a shift amount of a pilot signal contained in a received signal from an original subcarrier position to a subcarrier position.

5. A receiving method of a receiving apparatus which receives signals, the receiving method comprising the steps of:
demodulating an IF signal obtained by subjecting a received RF signal to frequency conversion;
detecting a carrier wave frequency error contained in the IF signal;
correcting a frequency error of a frequency used for a demodulation process based on the detected carrier wave frequency error; and
controlling a setting of an initial value of the frequency used in the demodulation process after a receiving channel is switched, based on the carrier wave frequency error before the receiving channel is switched,
the initial value of the frequency is set by adding an IF signal frequency error to a desired IF signal frequency, and the IF signal frequency error is computed by multiplying the carrier wave frequency error before the receiving channel is switched by a ratio of frequencies.

6. The receiving method according to claim 5, wherein the step of controlling the setting of the initial value of the frequency in the demodulation process after the receiving channel is switched includes the step of estimating a frequency error after the receiving channel is switched based on the carrier wave frequency error before the receiving channel is switched.

7. The receiving method according to claim 5, further comprising the step of setting a search area in which the carrier wave frequency error contained in the IF signal is detected based on an estimated frequency error after the receiving channel is switched.

8. A non-transitory computer-readable medium storing a computer-readable program which can be executed by a computer that controls a reception process of a receiving apparatus having a functionality of detecting a carrier wave frequency error contained in an IF signal obtained by subjecting a received RF signal to frequency conversion to correct a frequency error, the program allowing the computer to execute a process including the steps of:
computing an initial IF signal frequency error corresponding to the case in which an initial value of a frequency used for a demodulation process of the IF signal is a center frequency of a desired wave based on a detected result of the carrier wave frequency error contained in the IF signal before a receiving channel is switched; and
controlling a setting of the initial value of the frequency in the demodulation process after the receiving channel is switched based on an estimated result of a frequency error after the receiving channel is switched,
the initial value of the frequency is set by adding an IF signal frequency error to a desired IF signal frequency, and the IF signal frequency error is computed by multiplying the carrier wave frequency error contained in the IF signal before a receiving channel is switched by a ratio of frequencies.

9. The computer-readable storage medium according to claim 8, wherein the process further comprises the step of setting a search area in which the carrier wave frequency error contained in the IF signal is detected based on an estimated frequency error after a receiving channel is switched.

10. A receiving apparatus comprising:
- a demodulating unit which demodulates an IF signal obtained by subjecting a received RF signal to frequency conversion;
- a detecting unit which detects a carrier wave frequency error contained in the IF signal;
- a frequency control unit which sets an initial value of a frequency in the demodulation process done by the demodulating unit and for correcting a frequency error of a frequency used for the demodulation process done by the demodulating unit based on the carrier wave frequency error detected by the detecting unit; and
- a control unit which controls the setting of the initial value of the frequency in the demodulation process done by the demodulating unit by means of the frequency control unit after a receiving channel is switched, based on the carrier wave frequency error before the receiving channel is switched, the initial value of the frequency is set by adding an IF signal frequency error to a desired IF signal frequency, and the IF signal frequency error is computed by multiplying the carrier wave frequency error before the receiving channel is switched by a ratio of frequencies.

* * * * *